(12) United States Patent
O

(10) Patent No.: US 7,251,163 B2
(45) Date of Patent: Jul. 31, 2007

(54) FLASH MEMORY DEVICE INCLUDING BIT LINE VOLTAGE CLAMP CIRCUIT FOR CONTROLLING BIT LINE VOLTAGE DURING PROGRAMMING, AND BIT LINE VOLTAGE CONTROL METHOD THEREOF

(75) Inventor: Se-eun O, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 11/146,740

(22) Filed: Jun. 7, 2005

(65) Prior Publication Data
US 2005/0286302 A1    Dec. 29, 2005

(30) Foreign Application Priority Data
Jun. 23, 2004    (KR)    ............... 10-2004-0046952

(51) Int. Cl.
*G11C 11/34* (2006.01)
(52) U.S. Cl. .................... 365/185.18; 365/185.24
(58) Field of Classification Search ........... 365/185.18, 365/185.24
See application file for complete search history.

(56) References Cited

U.S. PATENT DOCUMENTS 6,128,221 A    10/2000  Chih ................. 365/185.18
7,042,765 B2 *  5/2006  Sibigtroth et al. ..... 365/185.13
2001/0028590 A1 * 10/2001 Ishikawa et al. ............ 365/226

FOREIGN PATENT DOCUMENTS

JP    2000-251487    9/2000
KR    10-2004-0008517    1/2004

* cited by examiner

*Primary Examiner*—Michael Tran
(74) *Attorney, Agent, or Firm*—Mills & Onello LLP

(57) ABSTRACT

In a flash memory device and a bit line voltage control method thereof a circuit capable of reducing the change in a voltage of a bit line during programming. The flash memory device includes: a flash memory cell, a source of which is connected to a source line, a drain of which is connected to a bit line and a gate of which is connected to a word line; a word line voltage generation circuit connected to the word line, for generating and providing a word line voltage to the word line; a program current generation circuit connected to the bit line, for generating and providing a program current to the bit line; and a bit line voltage clamp circuit connected to the bit line and the word line, for sensing a voltage of the bit line and controlling a bias current of the word line voltage generation circuit to thereby control a voltage of the bit line, during a programming operation of the flash memory device. Therefore, it is possible to enhance program efficiency and reduce program disturbance by constantly maintaining the voltage of the bit line to a desired voltage using a bit line voltage clamp circuit during programming.

11 Claims, 2 Drawing Sheets

FLASH MEMORY DEVICE INCLUDING BIT LINE VOLTAGE CLAMP CIRCUIT FOR CONTROLLING BIT LINE VOLTAGE DURING PROGRAMMING, AND BIT LINE VOLTAGE CONTROL METHOD THEREOF

BACKGROUND OF THE INVENTION

This application claims the priority of Korean Patent Application No. 2004-46952, filed on Jun. 23, 2004, in the Korean Intellectual Property Office, the disclosure of which is incorporated herein in its entirety by reference.

FIELD OF THE INVENTION

The present invention relates to a flash memory device, and more particularly, to a bit line voltage clamp circuit for controlling a bit line voltage during programming in a flash memory device, and a bit line voltage control method thereof.

DESCRIPTION OF THE RELATED ART

Flash memory devices have enjoyed widespread use in various electronic systems, such as mobile systems. FIG. 1 is illustrates circuitry related to program operations in a conventional flash memory device. Referring to FIG. 1, a flash memory cell array 11 includes a plurality of flash memory cells MCELLs. The source of each flash memory cell MCELL is connected to a source line SL, the drain thereof is connected to a bit line BL, and the gate thereof is connected to a word line WL.

The word line WL is connected to a word line voltage generation circuit 13, which generates and provides a word line voltage $V_{WL}$ to the word line WL. The bit line BL is connected to a program current generation circuit 15, which generates and provides a program current $I_{PGM}$ to the bit line BL.

In the flash memory device as described above, to start a programming operation, a voltage of about 9V is applied to the source line SL and a threshold voltage $V_{WL}$ of a selected memory cell MCELL is applied by the word line voltage generation circuit 13 to a word line WL connected to the selected memory cell MCELL. In this state, by controlling the program current generation circuit 15 such that a predetermined program current $I_{PGM}$ flows to a bit line BL connected to the selected memory cell MCELL, hot carriers are generated in the selected memory cell MCELL, thereby performing a program operation.

Meanwhile, a voltage of 0V is applied to word lines $WL_x$ that are connected to non-selected memory cells and a supply voltage VCCH is applied to bit lines $BL_x$ connected to the non-selected memory cells.

A voltage value $V_{BL}$ of the bit line BL connected to the selected memory cell MCELL is obtained by subtracting a threshold voltage $V_{TH}(MCELL)$ of the memory cell MCELL from the word line voltage $V_{WL}$, as in the following equation 1.

$$V_{BL}=V_{WL}-V_{TH}(MCELL) \quad (1)$$

The word line voltage $V_{WL}$ is provided by the word line voltage generation circuit 13, according to equation 2.

$$V_{WL}=V_{TH}(NM)+V_{TH}(RCELL) \quad (2)$$

The value $V_{TH}(NM)$ indicates a threshold voltage of a NMOS transistor NM in the word line voltage generation circuit 13 and the value $V_{TH}(RCELL)$ indicates a threshold voltage of a reference memory cell RCELL in the word line voltage generation circuit 13.

However, in the flash memory device described above, if the bit line voltage $V_{BL}$ becomes higher than a desired voltage, the voltage difference between the source and drain of the memory cell MCELL becomes smaller, which reduces programming efficiency. On the contrary, if the bit line voltage $V_{BL}$ becomes lower than the desired voltage, a voltage difference between the source and drain of a memory cell that is adjacent to the memory cell MCELL and shares the bit line and source line increases, which increases programming disturbance.

Accordingly, maintenance of the bit line voltage $V_{BL}$ at a substantially constant level during programming is very important to enhance program efficiency and reduce program disturbance.

However, in the conventional flash memory device shown in FIG. 1, the bit line voltage $V_{BL}$ is influenced by the change in the threshold voltage of the NMOS transistor NM in the word line voltage generation circuit 13 and by the mismatch between the threshold voltages of the main memory cell MCELL and the redundant memory cell RCELL in the word line voltage generation circuit 13, during programming.

For this reason, the bit line voltage $V_{BL}$ can be changed during a programming operation. As a result, programming efficiency can be lowered and programming disturbance can be increased.

SUMMARY OF THE INVENTION

The present invention provides a flash memory device including a circuit capable of reducing the change in a bit line voltage during a programming operation.

The present invention also provides a bit line voltage control method capable of reducing the change in a bit line voltage during a programming operation in a flash memory device.

In one aspect, the present invention is directed to a flash memory device comprising: a flash memory cell, a source of which is connected to a source line, a drain of which is connected to a bit line and a gate of which is connected to a word line; a word line voltage generation circuit connected to the word line that generates and provides a word line voltage to the word line; a program current generation circuit connected to the bit line that generates and provides a program current to the bit line; and a bit line voltage clamp circuit connected to the bit line and the word line that senses a voltage of the bit line and controls a bias current of the word line voltage generation circuit to thereby control a voltage of the bit line, during a programming operation of the flash memory device.

In one embodiment, the bit line voltage clamp circuit includes a current mirror that generates a current proportional to a change in a voltage of the bit line and that allows the current to flow from the word line to a reference voltage node.

In another embodiment, the current mirror comprises: a first MOS transistor a drain and a gate of which are connected to the bit line and a source of which is connected to the reference voltage node; and a second MOS transistor, a drain of which is connected to the word line, a gate of which is connected to the gate of the first MOS transistor, and a source of which is connected to the reference voltage node.

In another embodiment, the bit line voltage clamp circuit comprises: a first MOS transistor a drain and a gate of which are connected to the bit line and a source of which is connected to a reference voltage node; and a second MOS transistor, a drain of which is connected to the word line, a gate of which is connected to the gate of the first MOS transistor, and a source of which is connected to the reference voltage node.

In another aspect, the present invention is directed to a flash memory device comprising: a flash memory cell, a source of which is connected to a source line, a drain of which is connected to a bit line, and a gate of which is connected to a word line; a word line voltage generation circuit connected to the word line, that generates and provides a word line voltage to the word line; a program current generation circuit connected to the bit line, that generates and provides a program current to the bit line; and a bit line voltage clamp circuit connected to the bit line and the word line, that decreases the word line voltage when a voltage of the bit line increases to thereby decrease the voltage of the bit line by the decreased word line voltage, and that increases the word line voltage when a voltage of the bit line decreases to thereby increase the voltage of the bit line by the increased word line voltage, during a programming operation of the flash memory device.

In one embodiment, the bit line voltage clamp circuit comprises a current mirror that generates a current proportional to the program current flowing to the bit line and that allows the program current to flow from the word line to a reference voltage node.

In another embodiment, the current mirror comprises: a first MOS transistor a drain and a gate of which are connected to the bit line and a source of which is connected to the reference voltage node; and a second MOS transistor, a drain of which is connected to the word line, a gate of which is connected to the gate of the first MOS transistor, and a source of which is connected to the reference voltage node.

In another embodiment, the bit line voltage clamp circuit comprises: a first MOS transistor a drain and a gate of which are connected to the bit line and a source of which is connected to a reference voltage node; and a second MOS transistor, a drain of which is connected to the word line, a gate of which is connected to the gate of the first MOS transistor, and a source of which is connected to the reference voltage node.

In another aspect, the present invention is directed to a method for controlling a bit line voltage of a flash memory device, the flash memory device including: a flash memory cell, a source of which is connected to a source line, a drain of which is connected to a bit line, and a gate of which is connected to a word line; a word line voltage generation circuit connected to the word line, for generating and providing a word line voltage to the word line; and a program current generation circuit connected to the bit line, for generating and providing a program current to the bit line, the method comprising: during a programming operation of the flash memory device, sensing a voltage of the bit line and controlling a bias current of the word line voltage generation circuit to thereby control the voltage of the bit line.

In one embodiment, the method further comprises: generating a current proportional to the program current of the bit line and allowing the current to flow from the word line to a reference voltage node.

In another aspect, the present invention is directed to a method for controlling a bit line voltage of a flash memory device, the flash memory device including: a flash memory cell, a source of which is connected to a source line, a drain of which is connected to a bit line, and a gate of which is connected to a word line; a word line voltage generation circuit connected to the word line, for generating and providing a word line voltage to the word line; and a program current generation circuit connected to the bit line, for generating and providing a program current to the bit line, the method comprising: decreasing the word line voltage when a voltage of the bit line increases; decreasing the voltage of the bit line by the decreased word line voltage; increasing the word line voltage when the voltage of the bit line deceases; and increasing the voltage of the bit line by the increased word line voltage.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, embodiments of the present invention will be described in detail with reference to the appended drawings. The same reference numbers refer to the same components throughout the drawings.

Figure 1:
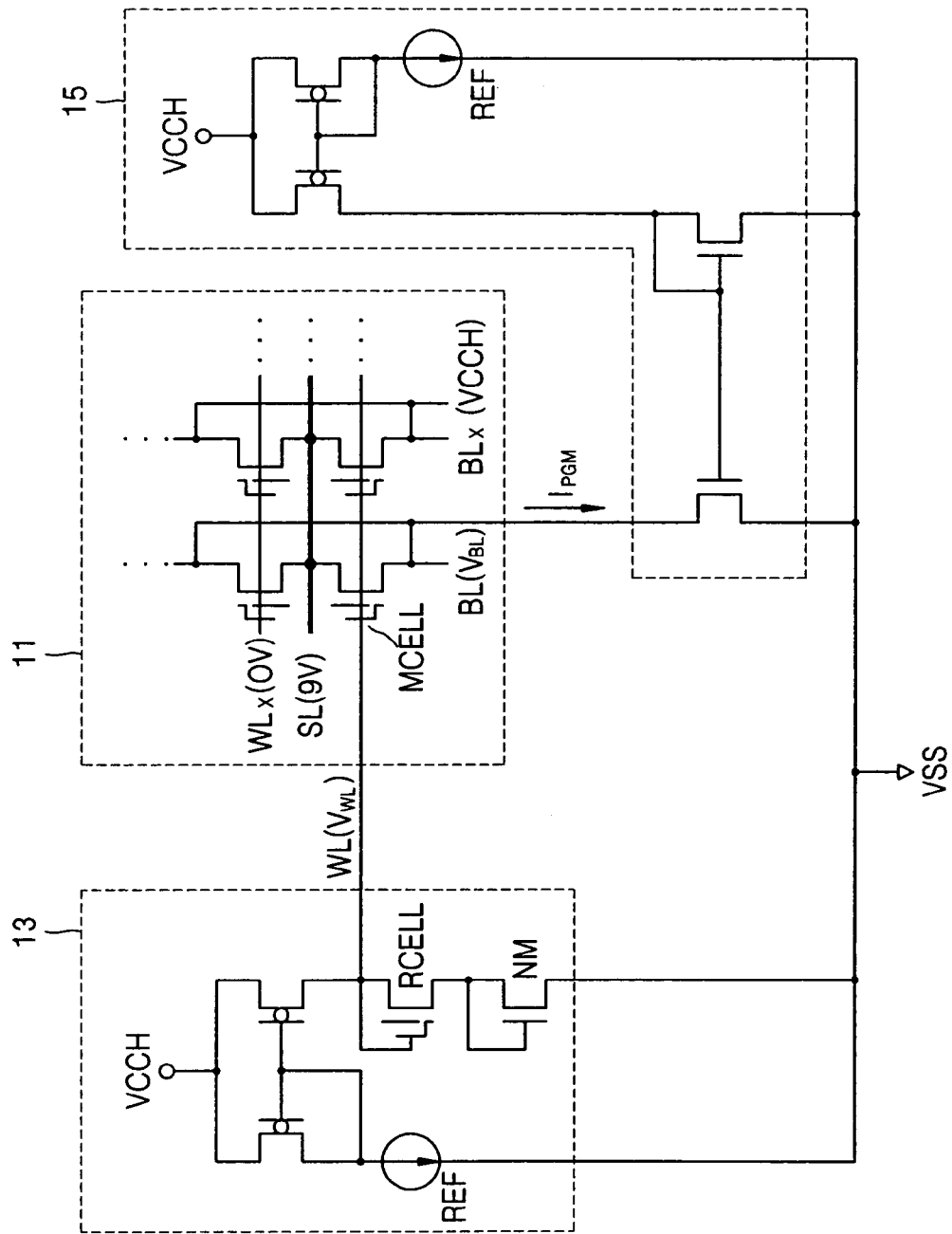
FIG. 1 is a circuit diagram of a conventional flash memory device.
Figure 2:
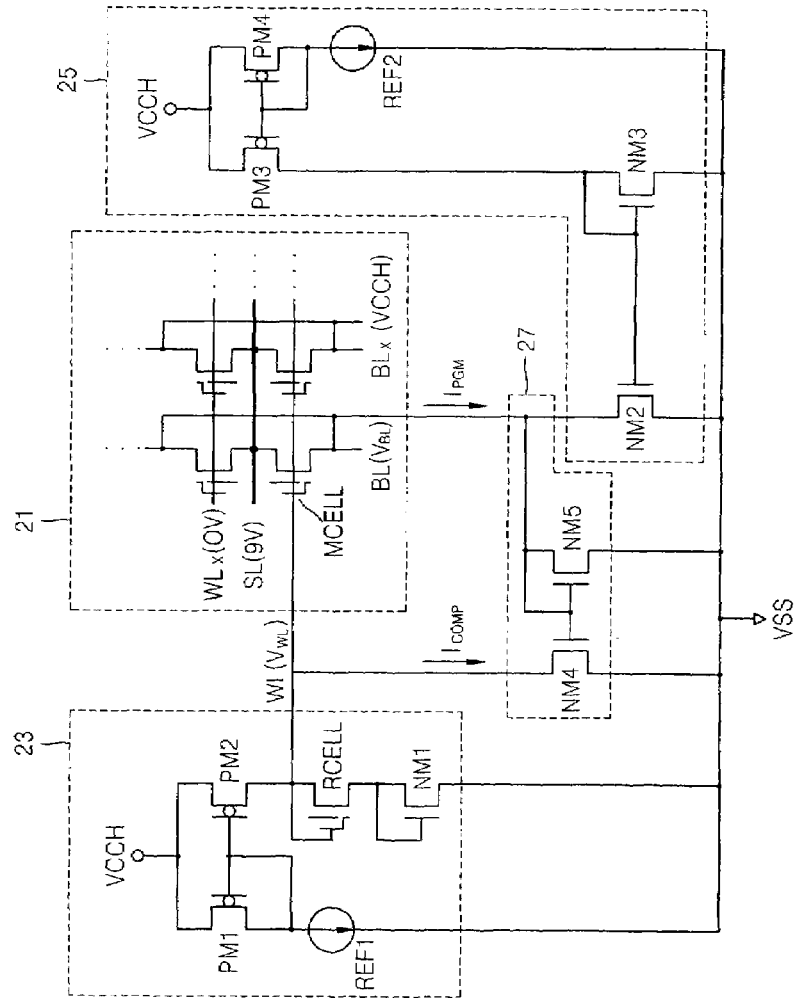
FIG. 2 is a circuit diagram of a flash memory device according to an embodiment of the present invention.

FIG. 2 is a circuit diagram of a flash memory device according to an embodiment of the present invention.

Referring to FIG. 2, the flash memory device comprises a flash memory cell array 21, a word line voltage generation circuit 23, a program current generation circuit 25, and a bit line voltage clamp circuit 27.

The flash memory cell array 21 includes a plurality of flash memory cells MCELLs. The source of each flash memory cell MCELL is connected to a source line SL, the bit line thereof is connected to a bit line BL, and the gate thereof is connected to a word line WL.

The word line voltage generation circuit 23 is connected to the word line WL to generate and provide a word line voltage $V_{WL}$ to the word line WL. The word line voltage generation circuit 23, which is a reference voltage generation circuit for generating a reference voltage, that is, a word line voltage $V_{WL}$, using a predetermined bias current, includes PMOS transistors PM1 and PM2, a reference memory cell RCELL, a NMOS transistor NM1, and a reference current source REF1.

The program current generation circuit 25 is connected to the bit line BL to generate and provide a program current $I_{PGM}$ to the bit line BL. The program current generation circuit 25 includes PMOS transistors PM3 and PM4, NMOS transistors NM2 and NM3, and a reference current source REF2.

The word line voltage generation circuit 23 and the program current generation circuit 25 are well known in the art and therefore detailed descriptions thereof are omitted.

The bit line voltage clamp circuit 27, which is connected to the bit line BL and the word line WL, senses a voltage $V_{BL}$ of the bit line BL to control a bias current of the word line voltage generation circuit 23, thereby controlling the voltage $V_{BL}$ of the bit line BL, during programming.

The bit line voltage clamp circuit 27 includes a current mirror which generates a current $I_{COMP}$ proportion to the change in the voltage of the bit line BL and allows the current $I_{COMP}$ to flow from the word line WL to a reference voltage node, that is, a ground voltage node VSS.

The current mirror includes a NMOS transistor NM5 the drain and gate of which are connected to each other and the source of which is connected to the reference voltage node VSS, and a NMOS transistor NM4 the drain of which is connected to the word line WL, the gate of which is connected to the gate of the NMOS transistor NM5 and the source of which is connected to the reference voltage node VSS.

In greater detail, during programming, a current $I_{COMP}$ proportional to a change $\Delta V_{BL}$ in the voltage of the bit line BL flows from the word line WL to the ground voltage node VSS through the bit line voltage clamp circuit 27. Accordingly, when the voltage $V_{BL}$ of the bit line BL increases, the current $I_{COMP}$ increases, thereby decreasing the voltage $V_{WL}$ of the word line WL. As a result, the voltage $V_{BL}$ of the bit line BL decreases an amount that depends on the decrease of the word line voltage $V_{WL}$, according to equation 1.

Meanwhile, when the voltage $V_{BL}$ of the bit line BL decreases, the current $I_{COMP}$ decreases, thereby increasing the voltage $V_{WL}$ of the word line WL. As a result, the voltage $V_{BL}$ of the bit line BL increases an amount that depends on the increase of the word line voltage $V_{WL}$, according to equation 1.

During programming, if the bit line voltage $V_{BL}$ becomes higher than a desired voltage due to the change in the threshold voltage of the NMOS transistor NM1 in the word line voltage generation circuit 23 and due to mismatch between the threshold voltages of the main memory cell MCELL and the redundant memory cell RCELL in the word line voltage generation circuit 23, the current flowing through the diode-connected NMOS transistor NM5 in the bit line voltage clamp circuit 27 increases and a current $I_{COMP}$ created through transistor NM4 by mirroring the current flowing through transistor MN5 also increases.

The increased current $I_{COMP}$ reduces a bias current of the word line voltage generation circuit 23, and accordingly, the voltage $V_{WL}$ of the word line WL is reduced, resulting in the decrease of the bit line voltage $V_{BL}$ according to equation 1.

During programming, if the bit line voltage $V_{BL}$ becomes lower than a desired voltage due to the change in the threshold voltage of the NMOS transistor NM1 in the word line voltage generation circuit 23 and due to mismatch between the threshold voltages of the main memory cell MCELL and the redundant memory cell RCELL in the word line voltage generation circuit 23, the current flowing through the diode-connected NMOS transistor NM5 in the bit line voltage clamp circuit 27 is reduced and accordingly the current $I_{COMP}$ created by mirroring the current flowing through the transistor MN5 is reduced.

The reduced current $I_{COMP}$ increases a bias current of the word line voltage generation circuit 23 and accordingly, the voltage $V_{WL}$ of the word line WL increases, resulting in the increase of a bit line voltage $V_{BL}$ according to equation 1.

As described above, in the flash memory device according to the present invention, it is possible to maintain the bit line voltage $V_{BL}$ at a substantially constant desired voltage using a bit line voltage clamp circuit 27 during a programming operation, thereby enhancing programming efficiency and reducing programming disturbance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flash memory device comprising:
   a flash memory cell, a source of which is connected to a source line, a drain of which is connected to a bit line and a gate of which is connected to a word line;
   a word line voltage generation circuit connected to the word line that generates and provides a word line voltage to the word line;
   a program current generation circuit connected to the bit line that generates and provides a program current to the bit line; and
   a bit line voltage clamp circuit connected to the bit line and the word line that senses a voltage of the bit line and controls a bias current of the word line voltage generation circuit to thereby control a voltage of the bit line, during a programming operation of the flash memory device.

2. The flash memory device of claim 1, wherein the bit line voltage clamp circuit includes a current mirror that generates a current proportional to a change in a voltage of the bit line and that allows the current to flow from the word line to a reference voltage node.

3. The flash memory device of claim 2, wherein the current mirror comprises:
   a first MOS transistor a drain and a gate of which are connected to the bit line and a source of which is connected to the reference voltage node; and
   a second MOS transistor, a drain of which is connected to the word line, a gate of which is connected to the gate of the first MOS transistor, and a source of which is connected to the reference voltage node.

4. The flash memory device of claim 1, wherein the bit line voltage clamp circuit comprises:
   a first MOS transistor a drain and a gate of which are connected to the bit line and a source of which is connected to a reference voltage node; and
   a second MOS transistor, a drain of which is connected to the word line, a gate of which is connected to the gate of the first MOS transistor, and a source of which is connected to the reference voltage node.

5. A flash memory device comprising:
   a flash memory cell, a source of which is connected to a source line, a drain of which is connected to a bit line, and a gate of which is connected to a word line;
   a word line voltage generation circuit connected to the word line, that generates and provides a word line voltage to the word line;
   a program current generation circuit connected to the bit line, that generates and provides a program current to the bit line; and
   a bit line voltage clamp circuit connected to the bit line and the word line, that decreases the word line voltage when a voltage of the bit line increases to thereby decrease the voltage of the bit line by the decreased word line voltage, and that increases the word line voltage when a voltage of the bit line decreases to thereby increase the voltage of the bit line by the increased word line voltage, during a programming operation of the flash memory device.

6. The flash memory device of claim 5, wherein the bit line voltage clamp circuit comprises a current mirror that generates a current proportional to the program current flowing to the bit line and that allows the program current to flow from the word line to a reference voltage node.

7. The flash memory device of claim 6, wherein the current mirror comprises:
   a first MOS transistor a drain and a gate of which are connected to the bit line and a source of which is connected to the reference voltage node; and
   a second MOS transistor, a drain of which is connected to the word line, a gate of which is connected to the gate of the first MOS transistor, and a source of which is connected to the reference voltage node.

8. The flash memory device of claim 5, wherein the bit line voltage clamp circuit comprises:
   a first MOS transistor a drain and a gate of which are connected to the bit line and a source of which is connected to a reference voltage node; and
   a second MOS transistor, a drain of which is connected to the word line, a gate of which is connected to the gate of the first MOS transistor, and a source of which is connected to the reference voltage node.

9. A method for controlling a bit line voltage of a flash memory device, the flash memory device including: a flash memory cell, a source of which is connected to a source line, a drain of which is connected to a bit line, and a gate of which is connected to a word line; a word line voltage generation circuit connected to the word line, for generating and providing a word line voltage to the word line; and a program current generation circuit connected to the bit line, for generating and providing a program current to the bit line, the method comprising:
   during a programming operation of the flash memory device, sensing a voltage of the bit line and controlling a bias current of the word line voltage generation circuit wherein the word line voltage is adjusted by the controlled bias current to thereby control the voltage of the bit line.

10. The method of claim 9, further comprising:
   generating a current proportional to the program current of the bit line and allowing the current to flow from the word line to a reference voltage node.

11. A method for controlling a bit line voltage of a flash memory device, the flash memory device including: a flash memory cell, a source of which is connected to a source line, a drain of which is connected to a bit line, and a gate of which is connected to a word line; a word line voltage generation circuit connected to the word line, for generating and providing a word line voltage to the word line; and a program current generation circuit connected to the bit line, for generating and providing a program current to the bit line, the method comprising:
   decreasing the word line voltage when a voltage of the bit line increases;
   decreasing the voltage of the bit line by the decreased word line voltage;
   increasing the word line voltage when the voltage of the bit line deceases; and
   increasing the voltage of the bit line by the increased word line voltage.

* * * * *